US008314445B2

(12) United States Patent
Rudenja et al.

(10) Patent No.: US 8,314,445 B2
(45) Date of Patent: Nov. 20, 2012

(54) PLASMONIC DEVICE, SYSTEM, AND METHODS

(75) Inventors: Sergei Rudenja, Winnipeg (CA); Michael S. Freund, Winnipeg (CA)

(73) Assignee: University of Manitoba, Winnipeg, Manitoba (CA)

(*) Notice: Subject to any disclaimer, the term of this patent is extended or adjusted under 35 U.S.C. 154(b) by 74 days.

(21) Appl. No.: 13/045,371

(22) Filed: Mar. 10, 2011

(65) Prior Publication Data

US 2011/0220814 A1 Sep. 15, 2011
US 2012/0104288 A9 May 3, 2012

Related U.S. Application Data

(60) Provisional application No. 61/312,388, filed on Mar. 10, 2010.

(51) Int. Cl.
*H01L 31/101* (2006.01)
*H01L 21/00* (2006.01)

(52) U.S. Cl. .......................... 257/113; 438/57
(58) Field of Classification Search ............... 438/48, 438/57, 75, 98; 257/113–118
See application file for complete search history.

(56) References Cited

U.S. PATENT DOCUMENTS

2010/0129085 A1* 5/2010 Smolyaninov et al. ........ 398/141
2011/0168257 A1* 7/2011 Kochergin .................... 136/258

OTHER PUBLICATIONS

D. M. Schaadt, B. Feng, E. T. Yu, "Enhanced semiconductor optical absorption via surface plasmon excitation in metal nanoparticles," Applied Physics Letters, 86, 063106-1-063106-3, Feb. 2, 2005.*
Aviram, "Molecules for memory, logic, and amplification," *J. Am. Chem. Soc.*, Aug. 1988, 110(17): 5687-5692.
*Axis Ultra$^{DLD}$ Operators Manual*, Kratos Analytical Ltd., Manchester, U.K., 2005, title page, copyright page, and table of contents. 10 pgs.
Barnes et al., "Surface plasmon subwavelength optics," *Nature*, Aug. 14, 2003, 424: 824-830.
Barnes et al., "Surface Plasmon Polaritons and Their Role in the Enhanced Transmission of Light through Periodic Arrays of Subwavelength Holes in a Metal Film," *Phys. Rev. Lett.*, Mar. 12, 2004, 92(10): 107401-1 to 107401-4. Available online Mar. 9, 2004.
Bergman et al., "The Physical Properties of Macroscopically Inhomogeneous Media," *Solid State Physics* 46, 147-269 (1992).
Bloor et al., "Spectroscopic studies of polyaniline," *Synthetic Metals*, Aug.-Oct. 1987, 21(1-3): 175-179.
Bredas et al., "Polarons, bipolarons, and solitons in conducting polymers," *Acc. Chem. Res.*, Oct. 1985, 18(10) 309-315.
Bredas et al., "Organic semiconductors: A theoretical characterization of the basic parameters governing charge transport," *PNAS* Apr. 30, 2002, 99(9) 5804-5809.
Briggs et al., *Practical surface analysis : by auger and x-ray photoelectron spectroscopy*, John Wiley & Sons, Chichester, U.K. 1983, title page, copyright page, and table of contents only; 9 pgs.
Briggs, *Surface Analysis of polymers by XPS and static SIMS*, Cambridge University Press, Cambridge, U.K., 1998, title page, copyright page, and table of contents only; 4 pgs.

(Continued)

Primary Examiner — Calvin Lee
(74) *Attorney, Agent, or Firm* — Mueting Raasch & Gebhardt, P.A.

(57) ABSTRACT

A thin-film plasmonic device including a layer of a conductive material positioned over an array of electrodes of alternating polarity.

14 Claims, 6 Drawing Sheets

OTHER PUBLICATIONS

Epstein et al., "Insulator-Metal Transition and Metallic State in Conducting Polymers," Chapter 15 in *Handbook of Conducting Polymers*, Marcel Dekker, Inc., New York, NY, Skotheim et al. eds., 2007, 76 pgs.

Fahlman et al., "Photoelectron Spectroscopy Studies on the Electric and Chemical Structures of Conjugated Polymers," Chapter 5 in *Organic Electronic Materials: Conjugated Polymers and Low Molecular Weight Organic Solids*, Farchioni et al. eds., Springer Verlag, Berlin, Germany, 2001, title page, copyright page, and pp. 181-212.

Fave et al., "Tunable Electrochemical Switches Based on Ultrathin Organic Films," *J. Amer. Chem. Soc.*, Feb. 21, 2007, 129(7): 1890-1891. Available online Jan. 25, 2005.

*Handbook of Conducting Polymers*, Marcel Dekker, Inc., New York, NY, Skotheim et al. eds., 1998, title page, copyright page, and table of contents only; 5 pgs.

Homola, "Present and future of surface plasmon resonance biosensors," *Analytical and Bioanalytical Chemistry*, Oct. 2003, 377(3): 528-539. Available online Jul. 19, 2003.

Hüfner, *Photoelectron Spectroscopy; Principles and Applications*, Springer-Verlag, Berlin, Germany, 2003, title page, copyright page, and table of contents only; 7 pgs.

Kang et al., "Surface Plasmon Resonance Studies on the Electrochemical Doping/Dedoping Processes of Anions on Polyaniline-Modified Electrode," *Langmuir*, Dec. 24, 2002, 18(26): 10305-10310. Available online Nov. 21, 2002.

Kohlman et al., "Drude Metallic Response of Polypyrrole," *Phys. Rev. Lett.*, Jan. 30, 1995, 74(5), 773-776.

Kohlman et al., "Insulator-Metal Transition and Inhomogeneous Metallic State in Conducting Polymers," Chapter 3 in *Handbook of Conducting Polymers*, Marcel Dekker, Inc., New York, NY, Skotheim et al. eds., 1998, pp. 85-122.

Kurth et al., "Determination of the intrinsic bulk and surface plasmon intensity of XPS spectra of magnesium," *Applied Surface Science*, Dec. 2003, 220(1-4): 60-78.

Lacroix et al., "Polyaniline: A Very Fast Electrochromic Material," *J. Electrochem. Soc.*, May 1989, 136(5), 1308-1313.

Leroux et al., "Conducting Polymer Electrochemical Switching as an Easy Means for Designing Active Plasmonic Devices," *J. Amer. Chem. Soc.*, Nov. 23, 2005, 127(46), 16022-16023. Available online Oct. 26, 2005.

Leroux et al., "Conducting polymer/gold nanoparticle hybrid materials: A step toward electroactive plasmonic devices," *Electrochemistry Communications*, Jun. 2007, 9(6), 1258-1262. Available online Jan. 17, 2007.

Leroux et al., "Tunable Electrochemical Switch of the Optical Properties of Metallic Nanoparticles," *ACS Nano*, Apr. 2008, 2(4), 728-732. Available online Apr. 5, 2008.

Leroux et al., "Active Plasmonic Devices with Anisotropic Optical Response: A Step Toward Active Polarizer," *Nano Lett.*, 2009, 9(5), 2144-2148. Available online Apr. 10, 2009.

Lezec et al., "Beaming light from a subwavelength aperture," *Science*, Aug. 2, 2002, 297(5582), 820-822. Available online Jun. 20, 2002.

Lezec et al., "Diffracted evanescent wave model for enhanced and suppressed optical transmission through subwavelength hole arrays," *Optics Express*, Aug. 9, 2004, 12(16), 3629-3651.

Liedberg et al., "Biosensing with surface plasmon resonance—how it all started," *Biosensors & Bioelectronics*, Fall 1985, 10(8), i-ix.

Maier et al., "Local detection of electromagnetic energy transport below the diffraction limit in metal nanoparticle plasmon waveguides," *Nature Materials*, Apr. 2003, 2(4): 229-232. Available online Mar. 2, 2003.

Mathew et al., "A solid state NMR characterization of cross-linked polyaniline powder," *Synthetic Metals*, Nov. 20, 2002, 131(1-3), 141-147. Available online Sep. 19, 2002.

Monkman et al., "Electronic energy levels of polyaniline," *J. Phys. D: Appl. Phys.*, Nov. 4, 1987 20(11), 1337-1345.

Monkman et al., "X-ray photoelectron spectroscopic investigations of the chain structure and doping mechanisms in polyaniline," *J. Phys. D: Appl. Phys.*, May 14, 1991, 24(5), 738-749.

Nylander et al., "Gas detection by means of surface plasmons resonance," *Sensors and Actuators B*, 1982, 3: 79-88.

Prigodin et al., "Nature of insulator—metal transition and novel mechanism of charge transport in the metallic state of highly doped electronic polymers," *Synthetic Metals*, Nov. 2, 2001, 125(1), 43-53.

Prigodin et al., "Electric Field Control of Charge Transport in Doped Polymers," *Synthetic Metals*, Sep. 21, 2005, 153(1-3), 157-160. Available online Sep. 8, 2005.

Raether, "Surface Plasma Oscillations and Their Applications," in *Physics of Thin Films*, vol. 9, Hass et al. eds., Academic Press, New York, NY, 1977, title page, copyright page, and pp. 145-261.

Sakamoto et al., "Photoemission study of polypyrrole and polyaniline," *Synthetic Metals*, May 1999, 101(1-3), 479-480.

Smith, "Angular Dependent Photoemission," Chapter 6 in *Topics in applied physics* vol. 26/1978: *Photoemissions in Solids I: General Principles*, Cardona et al. eds., Springer-Verlag, Berlin, Germany, 1978, title page, copyright page, and pp. 237-264.

Stauffer et al., "Introduction to Percolation Theory," 2nd ed., 1992, Taylor & Francis, London, U.K., title page, copyright page, and table of contents; 4 pgs.

Steiner et al., "Analysis of the plasmon structure in XPS experiments of simple metals," *Physical Letters A*, Jun. 13, 1977, 61A(6), 410-412 (1977).

Stroud, "Percolation effects and sum rules in the optical properties of composites," *Physical Review B*, Feb. 15, 1979, 19(4): 1783-1791.

Wei et al., "XPS study of highly sulfonated polyaniline," *Macromolecules*, May 4, 1999, 32(9), 3114-3117. Available online Apr. 15, 1999.

\* cited by examiner

PLASMONIC DEVICE, SYSTEM, AND METHODS

CROSS-REFERENCES TO RELATED APPLICATIONS

This application claims the benefit of U.S. Provisional Application No. 61/312,388, filed Mar. 10, 2010, herein incorporated by reference in its entirety.

BACKGROUND

Surface plasmon is a phenomenon that has been employed in the design of, for example, sensors, nonvolatile memory, and photonic devices. A surface plasmon is a surface charge density wave at a conducting surface excited by, for example, monochromatic light, X-ray radiation, or modulated frequency pulse. The propagation of a charge wave may come into resonance with a photon of energy from an excitation source, leading to a so-called surface plasmon resonance (SPR). This resonance is sensitive to the miniscule concentration of substances on top of the surface, or can be utilized in spontaneous charge/discharge/photon emission in nanostructured layers, paving the way for design of photonic and memory devices.

Phenomena involving plasmons have been the subject of study in recent years in seeking to overcome some limitations of conventional signal transfer in electronics (W. L. Barnes, Devaux, E., Ebbesen, T. W., *Nature,* 424, 825 (2003), W. L. Barnes, Murray, W. A., Dintinger, J., Devaux, E., Ebbesen, T. W., *Physical Review Letters,* 92, 107401 (2004)) and lowering the threshold of detection in biosensing. In general terms, a plasmon is a localized charge density wave or electronic plasma, oscillating near the surface or in the bulk of a material (H. Raether, in *Physics of Thin Films,* Volume 9, G. F. Hass, M., Hoffman, R. Editor, pp. 145-261, Academic Press, New York (1977), C. Nylander, Liedberg, B., Lind, T., *Sensors and Actuators,* 3, 79 (1982/1983), P. Steiner, Höchst, H., Hüfner, S., *Physical Review A,* 61A, 410 (1977)). The ability of this wave to come into resonance with a quantum of energy from an excitation source is instrumental for the design of plasmonic devices with a potential to excel in a variety of applications.

Devices based on surface plasmon resonance (SPR) have already found use in, for example, biochemistry and the pharmaceutical industry (C. Nylander, Liedberg, B., Lind, T., *Sensors and Actuators,* 3, 79 (1982/1983), J. Homola, *Analytical and Bioanalytical Chemistry,* 377, 528 (2003)), where SPR has been used to follow biochemical reactions and/or molecule adsorption on surfaces. In these applications, the plasmon is generated at the interface of dielectric and conducting layers. Through proper optical alignment of a Kretschmann's prism, the parallel component of incident light matches the dispersion of surface plasmons at the interface, thus giving a rise to the SPR. The Kretschmann's arrangement is very strict in terms of incident angle, laminarity of the layers, film thickness and, therefore, requires a precise manufacturing.

A variety of plasmonic devices have been developed by utilizing the ability of nanoparticles to absorb the light (W. L. Barnes, Devaux, E., Ebbesen, T. W., *Nature,* 424, 825 (2003), W. L. Barnes, Murray, W. A., Dintinger, J., Devaux, E., Ebbesen, T. W., *Physical Review Letters,* 92, 107401 (2004), S. A. Maier, Kik, P. G., Atwater, H. A., Meltzer, S., Hard, E., Koel, B. E., Requicha, A. G., *Nature Materials,* 2, 229 (2003)). These include waveguides, filters and polarizers (S. A. Maier, Kik, P. G., Atwater, H. A., Meltzer, S., Harel, E., Koel, B. E., Requicha, A. G., *Nature Materials,* 2, 229 (2003)), nanoscopic light sources (H. J. Lezec, Degiron, A., Devaux, E., Linke, R. A., Martin-Moreno, L., Garcia-Vidal, F. J., Ebbesen, T. W., *Science,* 297, 820 (2002)) and tunable plasmonic devices (Y. Leroux, Eang. E., Fave, C., Trippe, G., Lacroix, J. C., *Electrochemistry Communications,* 9, 1258 (2007), Y. Leroux, Lacroix, J. C., Chane-Ching, K., Fave, C., Felidj, N., Levi, G., Aubard, J., Krenn, J. R., Hohenau, A., *Journal of the American Chemical Society,* 127, 16022 (2005)). The absorption of light by nanoparticles varies with size and material and in turn provides a means to adjust the wavelength of absorbed light. The absorption of light in the visible or near-infrared region by nanoparticles has been explained by the presence of localized surface plasmons (LSP) (Y. Leroux, Lacroix, J. C., Fave, C., Trippe, G., Felidj, N., Aubard, J., Hohenau, A., Krenn, J., *Journal of the American Chemical Society,* 2, 728 (2008)), which depends on size and shape of nanoparticles. By coupling these systems with a surrounding medium that can be modulated, it may be possible to create switchable or tunable devices based on this phenomenon.

SUMMARY

This invention relates to sensors for, e.g., chemical, biochemical, or biological analysis, microelectronics, and photonics. Specifically, the present invention provides a plasmonic device that may be used in, for example, biochemical sensing, photonics (e.g., plasmonic switch, transistor), signal transfer and storage (e.g., nonvolatile memories), etc. Applications for one or more embodiments of the present disclosure also include, for example, plasmonic circuitry, subwavelength optics, light generation, microscopy, bio-photonics, etc.

In one or more preferred embodiments, the device is based on the discovery of a photoexcitation of intrinsic plasmon in a conductive polymer (e.g., polyaniline) film (e.g., 105 in FIG. 1) disposed (e.g., electrochemically deposited) over an interdigitated array (IDA), having alternating electrodes (e.g., 102 and 103 in FIG. 1) on an insulating substrate (e.g., 101 in FIG. 1). Under monochromatic radiation (e.g., 104 in FIG. 1) of, for example, an X-ray source in a photoelectron spectrometer, an additional feature of an XPS profile appears, characteristic of intrinsic plasmon generated in a complex screening mechanism of uncompensated photoholes. This may have implications in the percolation of conductive networks in conducting polymers.

In one or more embodiments, the present invention provides a plasmonic system including a thin-film plasmonic device that includes a layer of a conductive material positioned over an array of electrodes of alternating polarity.

In one or more embodiments, the present invention provides a plasmonic device including: an insulating substrate; alternating sets of electrically connected source and drain electrodes disposed on the insulating substrate; channels on the insulating substrate formed between the alternating electrodes; and a film including an organic conducting polymer overlaying the electrodes and channels.

In one or more embodiments, the present invention provides an electroactive plasmonic system including: a single thin-film device including a conductive dielectrically heterogeneous media disposed over an array of gold electrodes of alternating polarity on a dielectric substrate; a radiation source fixed in position relative to the film and arranged to direct a monochromatic beam through the film to achieve photoemission of electrons and to excite surface plasmons; and an array of photodetectors or electron detectors arranged so as to detect the shift peak electron photoemission or light adsorption peak at the surface at which surface plasmon occurs.

In one or more embodiments, the present invention provides a method of making a plasmonic device, the method includes: providing an insulating substrate; positioning alternating sets of source and drain electrodes on the insulating substrate such that channels are formed on the insulating substrate between the alternating electrodes; and electrochemically depositing a film comprising an organic conducting polymer on the electrodes and channels.

In one or more embodiments, the present invention provides a method of generating plasmons in a conducting polymer, the method including: providing a plasmonic device including: an insulating substrate; alternating sets of electrically connected source and drain electrodes disposed on the insulating substrate; channels on the insulating substrate formed between the alternating electrodes; and a film comprising an organic conducting polymer overlaying the electrodes and channels; and irradiating the conducting polymer under conditions effective to emit photoelectrons.

The term's "comprises" and variations thereof do not have a limiting meaning where these terms appear in the description and claims.

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the invention.

As used herein, "a," "an," "the," "at least one," and "one or more" are used interchangeably.

As used herein, the term "or" is generally employed in its sense including "and/or" unless the content clearly dictates otherwise.

The term "and/or" means one or all of the listed elements or a combination of any two or more of the listed elements.

Also herein, all numbers are assumed to be modified by the term "about" and preferably by the term "exactly." Notwithstanding that the numerical ranges and parameters setting forth the broad scope of the invention are approximations, the numerical values set forth in the specific examples are reported as precisely as possible. All numerical value, however, inherently contain certain errors necessarily resulting from the standard deviation found in their respective testing measurements.

Also herein, the recitations of numerical ranges by endpoints include all numbers subsumed within that range (e.g., 1 to 5 includes 1, 1.5, 2, 2.75, 3, 3.80, 4, 5, etc.).

The above summary of the present invention is not intended to describe each disclosed embodiment or every implementation of the present invention. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

BRIEF DESCRIPTION OF THE FIGURES

FIG. 6 also shows an XPS graph, representing small spot analyses with a field of view (FOV2) of a 27-micrometer diameter positioned above the electrode (upper curve) and above the channel (lower curve).

DETAILED DESCRIPTION OF ILLUSTRATIVE EMBODIMENTS

The present invention is based on the discovery of plasmon photoexcitation in a conductive material, such as a conductive polymer (e.g., conductive polyaniline, in particular, the emeraldine salt form) deposited over an array of alternating electrodes (e.g., electrodes of alternating polarity). The plasmon excitation is observed using x-ray photoelectron spectroscopy (XPS), where the plasmon manifests itself through the loss of energy by emanating photoelectrons, leading to the appearance of an additional strong peak in the spectrum. These results show that conducting polymers are not limited to modulating plasmon behavior in other materials thereby acting as 'building blocks' of molecular devices (A. Aviram, *Journal of the American Chemical Society*, 110, 5687 (1988)), but under suitable conditions, may develop plasmon-like phenomena of their own.

Figure 1:
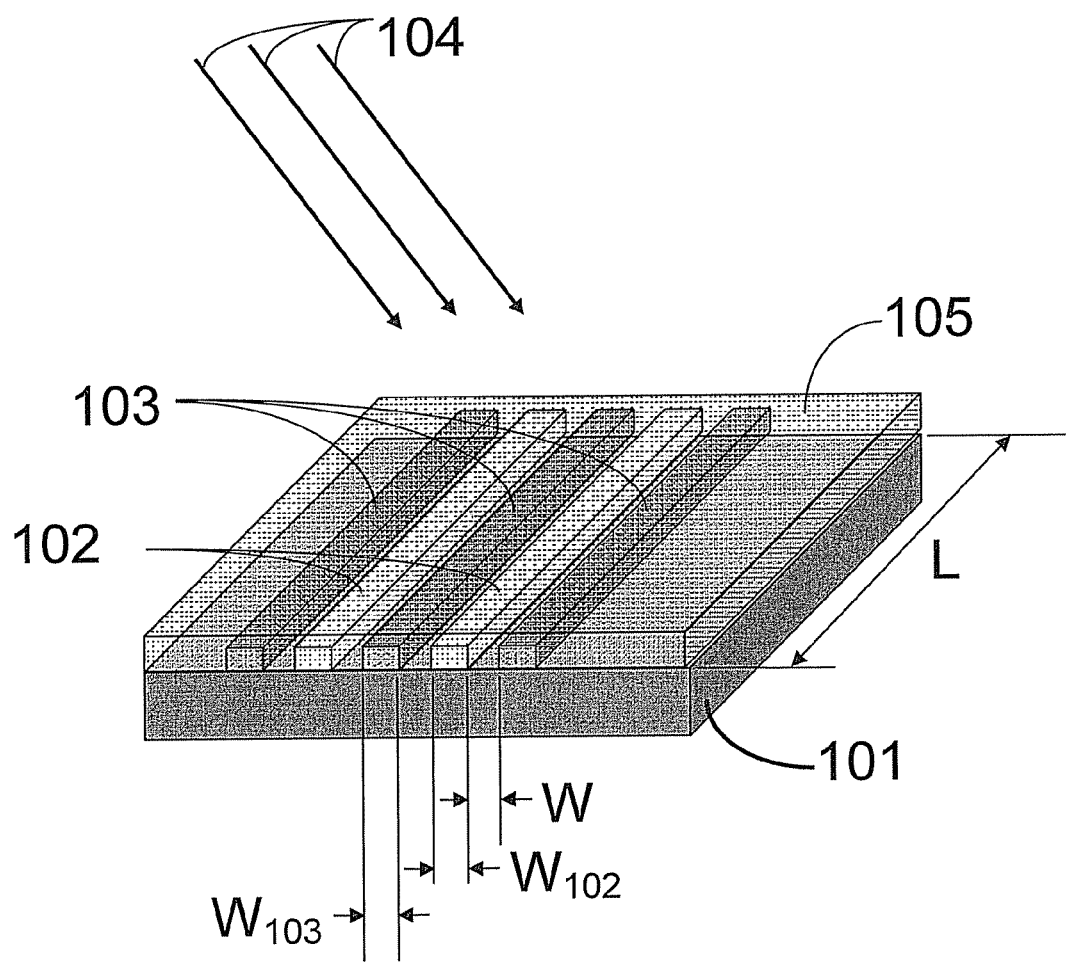
FIG. 1 shows an exemplary schematic of a portion of a thin film plasmonic device (TFPD) according to one or more embodiments of the present disclosure, having dielectrically heterogeneous material disposed over electrodes and a substrate.

Thus, the present invention provides a device, preferably in the form of a single layer (i.e., thin film) device (e.g., as represented by FIG. 1), as opposed to known laminar structures of plasmonic devices, assembled on top of optical prisms. In such devices, the fractions of variable dielectric function of same material are mixed and the total conductivity is determined on the basis of percolation of conducting network throughout the thin film.

Specifically, the present disclosure provides a plasmonic device that may be used in, for example, biochemical sensing, photonics (e.g., plasmonic switch, transistor), signal transfer and storage (e.g., nonvolatile memories), etc. Applications for one or more embodiments of the present disclosure may include, for example, plasmonic circuitry, subwavelength optics, light generation, microscopy, bio-photonics, etc.

In one or more embodiments, the conductive layer (i.e., the layer of conductive material) may include dielectrically heterogeneous media. Dielectrically heterogeneous media may include, for example, a conducting polymer, a mixed metal-insulator semiconductor, an anisotropic material, or combinations thereof. Dielectrically heterogeneous media may include a polymer having localized closely packed polymer chains that may form, for example, crystalline regions having relatively higher conductivity, and loosely packed polymer chains that may fowl, for example, a matrix having relatively lower conductivity. Dielectrically heterogeneous media may include a conducting polymer having, for example, a composite of variable dielectric functions. One having ordinary skill in the art will recognize other materials that may be suitable dielectrically heterogeneous media.

In one or more embodiments, a conducting polymer (e.g., an organic conducting polymer) may include polyaniline (PAni) (Sigma Aldrich, St. Louis, Mo.), polypyrrole (PPY) (Sigma Aldrich, St. Louis, Mo.), polyethylenedioxythiophene (PEDOT) (Sigma Aldrich, St. Louis, Mo.), polyaniline boronic acid (PABA), each of which may be optionally externally doped or self-doped, or combinations thereof. For example, the conducting polymer may include sulphate-doped polyaniline, sodium dodecylbenzene sulfonate-doped polypyrrole, perchlorate-doped polyethylenedioxythiophene, or any other conducting polymer able to develop a percolation conductive network across the layer. Additional aspects of polyaniline may be found in the Electrochemistry of the PAni/SO4- films section of the Examples.

In one or more embodiments, the conducting polymer may be electrodeposited over an array of alternating electrodes. For example, electrodeposition of polyaniline is described in the Electrochemistry-Film Deposition section of the Examples herein. Polyaniline may be electrodeposited from a solution of sulfuric acid (e.g., 2 Molar) (Sigma Aldrich, St. Louis, Mo.) supporting electrolyte with aniline (e.g., 0.1 Molar) (Sigma Aldrich, St. Louis, Mo.). Electropolymerization of, for example, an emeraldine film may be achieved galvanostatically to a thickness, which may be controlled by controlling the time of deposition for a given current density.

In one or more embodiments, a mixed metal-insulator semiconductor may include Ag/KCl, Al/Ge, or a combination thereof.

An anisotropic material, in one or more embodiments, may include an intercalated graphite (e.g., calcium graphite, etc.), a high-temperature superconductor (e.g., copper oxide superconductors, iron-based superconductors, metallic low-temperature superconductors, etc.), or a combination thereof.

In one or more embodiments of the present disclosure, a conductive material may include an organic and/or inorganic material able to form a conductive percolation network through insulating bulk matrix. Details regarding forming a conductive percolation network through insulating bulk matrix have been reported. (V. N. Prigodin, Hsu, F. C., Kim, Y. M., Park, J. H., Waldmann, O., Epstein A. J., *Synthetic Metals*, 153, 157 (2005); V. N. Prigodin, Epstein, A. J., *Synthetic Metals*, 125, 43 (2002); T. A. Skotheim, Elsenbaumer, R. L., Reynolds, J. R., *Handbook of Conducting Polymers*, pp. 1-1097, Marcel Decker, New York (1998); and R. S. Kohlman, A. J. Epstein, in *Handbook of Conducting Polymers*, pp. 85-122, Marcel Decker, New York (1998).)

In one or more embodiments, the conductive material positioned over an array of electrodes preferably includes the conductive material being directly disposed on the electrodes.

In one or more embodiments of the present disclosure, a system may include a radiation source, which may be fixed in position relative to a thin-film plasmonic device. The radiation source may be arranged to direct a monochromatic beam (e.g., 104 in FIG. 1) through the film to, for example, achieve photoemission of electrons and, for example, excite surface plasmons. In some embodiments, the radiation source may include an X-ray source, a UV source, an infrared source, a visible light source, or combinations thereof. For example, the radiation may include X-ray, UV light, infrared light, visible light, or combinations thereof, any of which may additionally be polarized (e.g., polarized X-ray, polarized UV light, polarized infrared light, polarized visible light, polarized infrared light, etc.). In one or more embodiments, radiation having fixed or variable wavelengths may be used. For example, polarized light of a fixed wavelength or a variable wavelength may be used. In one or more embodiments, polarized light may be manipulated (e.g., reflected) in such a way as to provide radiation of variable wavelength. For example, a radiation source may include a spectroscopic ellipsometer (J. A. Woollam Co., Inc., Lincoln, Nebr.), which may be capable of providing radiation over a wide spectral range (e.g., converting polarized light into variable frequency radiation). Additional aspects regarding the use of an X-ray source may be found in the X-Ray Photoelectron Spectroscopy section of the Examples herein.

In one or more embodiments of the present disclosure, a conducting material may include nanoparticles embedded in an organic polymer. For examples, nanoparticles may be embedded in a conducting polymer, as further described herein, such as PAni. For example, the nanoparticles may include gold nanoparticles, nanooxides (e.g., ruthenium oxide, etc.), clad nanoparticles (e.g., gold nanoparticles clad with silver, $ZnS/Mn^{2+}$ nanoparticles clad with chitosan (organic), gold nanoparticles clad with Pt/Ru, silver nanoparticles clad with diacetylene monomers, gold nanoparticles clad with a thiol, etc.), or mixtures thereof. In some embodiments, the nanoparticles of the present disclosure may be present in an amount sufficient to expand the excitation wavelength range of the device beyond that possible without the nanoparticles. For example, the excitation wavelength range for conducting polymers may be ultrashort, such as UV, whereas nanoparticles may expand the excitation wavelength range to the infrared wavelengths. In the present disclosure, the size of the nanoparticles may range from 1 nanometer (nm) to 20 nm, preferably from 5 nm to 20 nm. Herein, the size of the nanoparticles means the average of the largest dimensions of the nanoparticles (e.g., for a sphere, the largest dimension is the diameter).

In one or more embodiments, an array of detectors may be arranged so as to receive the reflected/generated excitation wave to record an absorption or shift of exciting wave indicative of plasmon resonance. In one or more embodiments, the array of detectors may include an array of photodetectors or electron detectors. For example, an array of photodetectors or electron detectors may be arranged so as to detect a shift peak electron photoemission or light absorption peak at the surface at which surface plasmon occurs. In one or more embodiments, an array of detectors may include, for example, a multichannel detector plate in a Delayed Line Detector (DLD), as discussed in the X-Ray Photoelectron Spectroscopy section of the Examples. One of skill in the art would recognize other arrays of detectors that would be suitable in the present disclosure.

One approach to LSP resonance modulation involves the use of conducting polymers as a media. The ability to modulate doping level and, in turn, carrier concentrations and carrier state energy, through the formation of new bands, may provide a means for modulating the LSP resonance polymer/nanoparticle composites. However, the role of conducting polymers as a surrounding media in plasmonic devices has been largely unexplored and is not well understood. As a result, it has been referred to as "synergism" (Y. Leroux, Eang. E., Faye, C., Trippe, G., Lacroix, J. C., *Electrochemis-* try *Communications*, 9, 1258 (2007)). The fact that, in early reports, a tunable plasmonic device could only be created when gold nanoparticles were deposited in a layer-by-layer configuration with a conducting polymer, suggested that the interactions may be complex. In a separate report on a surface plasmon resonance assembly, the conducting polymer was reported to function as a mediatory layer for immobilization of enzymes, causing doping/dedoping of the polymer and shifting the plasmon peak on a SPR assembly correspondingly (X. Kang, Jing, Y., Cheng, G., Dong, S., *Langmuir*, 18, 10305 (2002)). While these studies suggest that conducting polymers impact the plasmon resonance of metals, to date, there are no reports regarding the ability of conducting polymers to exhibit their own plasmon features as an inherent property of their heterogeneous conducting structure.

A physical description of the plasmon phenomenon is based on Drude dielectric functions, where two homogeneous materials with different dielectric functions, e.g., metal and dielectric, are brought into contact and the interface between the two materials becomes a site of a plasmon wave under an applied excitation source. Such an arrangement requires a high degree of precision in the manufacture of its optical moving parts to provide accurate measurement. An object of the present invention is to minimize or to overcome this disadvantage.

In the present invention, the localization of plasmons occurs at the interface of the grains (e.g., the crystalline portion of a conducting polymer) and the matrix (e.g., the portion of a conducting polymer having more loosely packed polymer chains) with variable dielectric function of the media. Given the stochastic nature of the distribution of grains through the matrix, the device of the present invention is less restricted to a precise setup of detectors, and may eliminate the need for the use of an optical prism all together.

In the present disclosure, source and drain electrodes may be arranged to form an array of electrodes (e.g., FIG. 1), such as an interdigitated array (IDA) of electrodes. To enhance the intensity of plasmon peak further to its most strong revealing form of an intrinsic plasmon, the layer of dielectrically heterogeneous material is positioned over an array of electrodes of alternating polarity (102 and 103 in FIG. 1). For example, in FIG. 1, electrodes of a first polarity 102 (e.g., a source electrode) are arranged with electrodes of an alternating polarity 103 (e.g., drain electrode). While the electrodes can be used for application of external electrical frequency source or voltage modulation and monitoring the signal amplitude variation, the placement of the dielectrically heterogeneous media over the array of electrodes, preferably on an insulating substrate, creates zones of preferential plasmon excitation. In these zones, namely the channels between electrodes, the dielectric function of the media is affected by an accumulation of positive charge with a restricted supply of the electrons used for replacement of the departed photoelectrons. Thus, an excess of positive charge is created in a form of polarons, which is localized over polymer chain. With the balance of excitation/suppression in offset, a complex screening process of polarons is initiated, forcing the photoelectrons to lose energy on their way out. Although not wishing to be bound by theory, it is believed that the loss of the energy is an intrinsic property of photoemission process and manifests itself in a plasmon loss energy peak.

In the present disclosure, the number of electrodes of alternating polarity may be any number greater than 1 (i.e., 2, 3, 4, 5, etc.). For example, in one or more embodiments, there may be two or more electrodes of alternating polarity (e.g., one source electrode and one drain electrode), three or more electrodes of alternating polarity (e.g., source, drain, source, or drain, source, drain), four or more electrodes of alternating polarity (e.g., source, drain, source, drain), etc. In some embodiments, there may be any larger number of electrodes (e.g., ten or more, one hundred or more, one thousand or more, even one million or more, etc.) of alternating polarity.

Electrodes of the present disclosure may be of any suitable length. In FIG. 1, the electrodes of alternating polarity (102 and 103) have about the same length L, but electrodes of alternating polarity need not have the same length. In the present disclosure, source electrodes may or may not have the same length and drain electrodes may or may not have the same length.

The present disclosure also provides a device (e.g., a plasmonic device) including an insulating substrate; alternating sets of electrically connected source and drain electrodes disposed on the insulating substrate; channels on the insulating substrate formed between the alternating electrodes; and a film including an organic conducting polymer overlaying the electrodes and channels.

In one or more embodiments, the substrate (e.g., an insulating substrate) may be constructed from a wide variety of materials. For example, the insulating substrate may include, but is not limited to, glass or an organic polymeric insulating material. In the present disclosure, an insulating substrate may be suitable for receiving alternating sets of electrically-connected source and drain electrodes to be disposed thereon (e.g., directly thereon). Further, insulating substrates of the present disclosure may also be suitable to receive a film including an organic conducting polymer to overlay channels between the electrodes (as well as the electrodes themselves). In one or more embodiments of the present disclosure, the substrate may be a dielectric substrate, which may include a wide variety of dielectric materials (e.g., polyethylene naphthalate, a cyclic olefin copolymer, silicon dioxide, or any other organic or inorganic dielectric material). One having ordinary skill in the art will recognize other suitable insulating substrate materials.

In some embodiments, electrodes may be constructed from a wide variety of materials (e.g., conductive materials). For example, electrodes in the present disclosure may include gold electrodes, copper electrodes, silver electrodes, ruthenium electrodes, or combinations thereof. One having ordinary skill in the art will recognize other suitable electrode materials and/or combinations of materials. Electrodes may have a variety of widths ($W_{102}$ and $W_{103}$ in FIG. 1). In one or more embodiments, the electrodes may be 75 micrometers to 350 micrometers wide. For example, the width of electrodes in the present disclosure may be 75 micrometers or greater, preferably 100 micrometers or greater, more preferably 200 micrometers or greater, or even more preferably 300 micrometers or greater. In one or more embodiments, the width of the electrodes in the present disclosure may be 350 micrometers or less, preferably 300 micrometers or less, more preferably 200 micrometers or less, or even more preferably 100 micrometers or less. In one or more embodiments, the electrodes may be less than 75 micrometers wide or more than 350 micrometers wide. In some embodiments, a particular source electrode may have the same or different width (e.g., $W_{102}$, in FIG. 1) as another source electrode or a drain electrode. In some embodiments, a particular drain electrode may have the same or different width (e.g., $W_{103}$ in FIG. 1) as another drain electrode or a source electrode. In some embodiments, all of the source electrodes have approximately the same width (e.g., $W_{102}$ in FIG. 1). In one or more embodiments, all of the drain electrodes have approximately the same width (e.g., $W_{103}$ in FIG. 1). Electrodes of the present disclosure may be of a wide variety of thicknesses. In one or more embodiments, the thickness of the electrodes may be 1 micrometer or less. For example, the electrodes may have a thickness of 800 nanometers or less, more preferably 600 nanometers or less, even more preferably 400 nanometers or less. In one or more embodiments, the electrode thickness may be 200 nanometers or less. In one or more embodiments, the electrode thickness may be 100 nanometers or more.

In one or more embodiments, channels between the alternating electrodes may have a width of 20 micrometers to 125 micrometers. For example, the width of channels between the alternating electrodes in the present disclosure may be 20 micrometers or greater, preferably 50 micrometers or greater, more preferably 75 micrometers or greater, or even more preferably 100 micrometers or greater. In one or more embodiments, the width of the channels between the alternating electrodes in the present disclosure may be 125 micrometers or less, preferably 100 micrometers or less, more preferably 75 micrometers or less, or even more preferably 50 micrometers or less. In one or more embodiments, the channel width may even be less than 20 micrometers or greater than 125 micrometers. In some embodiments, a particular channel may have the same or different width as another channel. In one or more embodiments, all of the channels have approximately the same width. Although the channels in FIG. 1 are depicted as being straight and having a constant width, the channels of the present disclosure may have a wide variety of shapes. A channel of the present disclosure may include, for example, one or more bends or curves along its length. Further, a channel of the present disclosure may have variable width along the length of the channel. Preferably, a channel of the present disclosure may have a constant width (e.g., generally constant within, for example, manufacturing tolerances) along a majority of the channel length. Preferably, the alternating electrodes are arranged such that a longitudinal axis of an electrode (e.g., the longitudinal axis in the direction of the electrode length, L) is generally parallel to the longitudinal axis of an adjacent alternating electrode along, for example, the length of the channel between such electrodes. In one or more embodiments, a longitudinal axis of an electrode in the length direction may be generally parallel to the longitudinal axis of at least a majority (e.g., all) of the other electrodes in a device.

In some embodiments, the film including an organic conducting polymer may have a thickness of 50 nanometers (nm) to 300 nanometers in the channels. For example, the film thickness in the present disclosure may be 50 nanometers or greater, preferably 100 nanometers or greater, more preferably 150 nanometers or greater, or even more preferably 200 nanometers or greater. In one or more embodiments, the film thickness in the present disclosure may be 300 nanometers or less, preferably 250 micrometers or less, more preferably 150 micrometers or less, or even more preferably 100 micrometers or less. In some embodiments, the film may be sufficiently thick for effective operation (i.e., the onset of conductivity) as total resistance across the device is about 0.1-50 kOhm (kiloOhm). For example, the film may be sufficiently thick for effective operation as the total resistance across the device is about 50 kOhm or less, more preferably 20 kOhm or less, even more preferably 15 kOhm or less, even more preferably 10 kOhm or less, even more preferably 5 kOhm or less, even more preferably 1 kOhm or less, and even more preferably 0.2 kOhm or less. In one or more embodiments, the film may be sufficiently thick for effective operation as the total resistance across the device is 0.1 kOhm or more, preferably 0.14 kOhm or more, even more preferably 0.5 kOhm or more, even more preferably 1 kOhm or more, even more preferably 8 kOhm or more, and even more preferably 20 kOhm or more. In one or more embodiments, the film (e.g., a film including sodium dodecylbenzene sulfonate-doped polypyrrole) may be sufficiently thick for effective operation (i.e., the onset of conductivity) as total resistance across the device is about 8-15 kOhm.

Although film 105 in FIG. 1 is not shown as being a conformal film, in one or more embodiments, the film 105 may be a conformal film (e.g., the film may define a morphologically uneven interface with the electrodes and may have a thickness that is approximately the same along the interface). Herein, film thickness means the average thickness of the film. In some embodiments, the film may be electrochemically deposited. One of ordinary skill will recognize other suitable methods for forming a film of the present disclosure.

In one or more embodiments, the channel width, W, may exceed the film 105 thickness by a factor of 10 or more, preferably 50 or more, and more preferably 100 or more. In one or more embodiments, the channel width may exceed the film thickness by a factor of 1000 or less, preferably 500 or less, and even more preferably 250 or less.

The present disclosure also provides a system (e.g., an electroactive plasmonic system) including a single thin-film device that includes a conductive dielectrically heterogeneous media disposed over an array of gold electrodes of alternating polarity on a dielectric substrate; a radiation source fixed in position relative to the film and arranged to direct a monochromatic beam through the film to achieve photoemission of electrons and to excite surface plasmons; and an array of photodetectors or electron detectors arranged so as to detect the shift peak electron photoemission or light adsorption peak at the surface at which surface plasmon occurs.

In one or more embodiments, the conductive dielectrically heterogeneous media is in the form of a film disposed over an array of electrodes of alternating polarity.

The present disclosure also provides a method of making a plasmonic device. The method of making includes: providing (or receiving) an insulating substrate; positioning alternating sets of source and drain electrodes on the insulating substrate such that channels are formed on the insulating substrate between the alternating electrodes; and electrochemically depositing a film comprising an organic conducting polymer on the electrodes and channels.

In one or more embodiments, providing (or receiving) alternating sets of source and drain electrodes on an insulating substrate such that the channels are formed on the insulating substrate between the alternating electrodes may include providing (or receiving) an interdigitated array (IDA) of electrodes on an insulating substrate. Interdigitated arrays of electrodes on insulating substrates may be commercially available from the Biomedical Microsensors Laboratory at North Carolina State University (Raleigh, N. C.).

In the present disclosure, a wide variety of methods may be used to position alternating sets of source and drain electrodes on the insulating substrate. Such methods include, but are not limited to microlithography, physical vapor deposition, chemical vapor deposition, photo resist etching, etc. Those of skill in the art will recognize other suitable methods for positioning alternating sets of source and drain electrodes on an insulating substrate.

In one or more embodiments, depositing a film on the electrodes and channels includes depositing a film on the substrate on which the electrodes are disposed in the space between the electrodes (e.g., in the channels).

As used herein, an alternating set of electrodes (e.g., an alternating set of source and drain electrodes) includes a pair of electrodes arranged such that the electrodes are in an alternating sequence (alternating sequence meaning, e.g., source electrode, drain electrode, source electrode, drain electrode, etc.) wherein channels are located between the electrodes.

The present disclosure also provides a method of generating plasmons in a conducting polymer. The method includes: providing a plasmonic device that includes an insulating substrate; alternating sets of electrically connected source and drain electrodes disposed on the insulating substrate; channels on the insulating substrate formed between the alternating electrodes; and a film comprising an organic conducting polymer overlaying the electrodes and channels. The method also includes irradiating the conducting polymer under conditions effective to emit photoelectrons.

It has been reported in the literature that conducting polymers have a Drude metallic response, similar to ordinary metals (R. S. Kohlman, Joo, J., Wang, Y. Z., Pouget, J. P., Kaneko, H., Ishiguro, T., Epstein, A. J., *Physical Review Letters*, 74, 773 (1995)). On the other hand, it has been reported that the conducting polymers are inhomogeneous materials in terms of conductivity (V. N. Prigodin, Hsu, F. C., Kim, Y. M., Park, J. H., Waldmann, O., Epstein. A. J., *Synthetic Metals*, 153, 157 (2005), V. N. Prigodin, Epstein, A. J., *Synthetic Metals*, 125, 43 (2002)). For example, while not wishing to be bound by theory, regions of closely packed polymer chains form crystalline regions that may be responsible for most of the polymers conductivity, while the loosely packed polymer chains represent a matrix with lower conductivity. The structure of conducting polymers may be described as a composite of variable dielectric functions, where the excitation of plasmons is possible at the interfaces separating crystals (e.g., closely-packed polymer chains) from matrix (loosely-packed polymer chains) (V. N. Prigodin, Epstein, A. J., *Synthetic Metals*, 125, 43 (2002)). Given the inhomogeneity of conducting polymers associated with a conductive percolation network throughout polymer, plasmon-like excitations have been predicted near the percolation threshold (T. A. Skotheim, Elsenbaumer, R. L., Reynolds, J. R., *Handbook of Conducting Polymers*, pp. 1-1097, Marcel Decker, New York (1998); R. S. Kohlman, A. J. Epstein, in *Handbook of Conducting Polymers*, pp. 85-122, Marcel Decker, New York (1998).). The percolation threshold in composite materials is a parameter around which some physical phenomena may be observed, including the quantum Hall effect, anomalous diffusion, ballistic transport in quantum well heterogeneous structure, and surface plasmons (D. J. Bergman, Stroud, D., *Properties of macroscopicalli inhomogenious media*, p. 405, Academic Press, San Diego (1992); "The Physical Properties of Macroscopically Inhomogeneous Media," D. J. Bergman and D. Stroud, Solid State Physics 46, 148-270 (1992)). The present disclosure provides plasmonic devices that may exploit the dielectric heterogeneity of conducting polymers and generate plasmon phenomena along the conducting percolation networks in the matrix of dissimilar dielectric function.

As a conductor/semiconductor with heterogeneous dielectric function, the bulk effective conductivity $\sigma_e$ of a conducting polymer may be regulated by a percolation theory of a random mixture of insulator and conductor and a Drude dielectric function of the fractions (e.g., the fractions of relatively higher and relatively lower conductivity). From a symmetric effective medium approximation (D. Stauffer, Aharony, A., *Introduction to Percolation Theory*, $2^{nd}$ ed., Taylor and Francis, London (1992), D. Stroud, *Physical Review B*, 19, 1783 (1979)), the random mixture of insulator and conductor changes its conductivity abruptly when the conductor fraction reaches a percolation threshold, which in the volume fraction is equal to about ⅓. The vicinity of the percolation threshold is a critical area for the rise of the plasmon band resonances.

The Drude dielectric function for a volume fraction p of metal-like conductor $$\varepsilon_A(\omega) = 1 - \frac{\omega_p^2}{\omega(\omega + i/\tau)},$$

where $\omega_p$ is the Drude electronic plasma frequency in a conductor, e.g. $\omega_p \approx 10^{15}$ sec$^{-1}$, $\tau$ is a relaxation time and $\omega$ is a frequency. The bulk of the composite is an insulator with a dielectric constant $\varepsilon_B(\omega)=1$ and volume fraction of 1−p. The effective dielectric constant $\varepsilon_e$ is a complex function of both functions (i.e., $\varepsilon_A$ and $\varepsilon_B$) and for a high concentration of conducting fraction in the composite; it is defined through an effective medium approximation.

With a frequency range where $\omega=\omega_p/\sqrt{3}$ and with a conductive fraction p approaching ⅓, the real part of the alternating current conductivity $R_e[\sigma_e(\omega)]$ may become very large and give rise to a plasmon resonance, resulting in a strong absorption line (e.g., increased absorption values represented by a higher absorption curve). Below the value of the percolation threshold, the conductivity function is dominated by a band of surface plasmons, originating from electromagnetic interaction between individual conductive crystals (localized, densely packed polymer chains). The absorption peak reaches its maximum passing the percolation threshold and fades away with an increase of the conductivity function. Similarly to the real part of effective conductivity, the energy loss function −Im[1/$\varepsilon_e(\omega)$] develops peaks related to the plasmon resonances (D. Stroud, *Physical Review B*, 19, 1783 (1979)) at the frequency $\omega=\omega_p$ and at the volume fraction p>⅓.

The present disclosure also provides the following exemplary embodiments:

Embodiment 1

A plasmonic system comprising a thin-film plasmonic device comprising a layer of a conductive material positioned over an array of electrodes of alternating polarity.

Embodiment 2

The system of embodiment 1, wherein the conductive layer comprises dielectrically heterogeneous media.

Embodiment 3

The system of embodiment 2, wherein the dielectrically heterogeneous media comprises a conducting polymer, a mixed metal-insulator semiconductor, an anisotropic material, or combinations thereof.

Embodiment 4

The system of embodiment 3, wherein the conducting polymer comprises polyaniline (PAni), polypyrrole (PPY), polyethylenedioxythiophene (PEDOT), polyaniline boronic acid (PABA), each of which is optionally externally doped or self-doped, or combinations thereof.

Embodiment 5

The system of embodiment 4, wherein the conducting polymer comprises sulphate-doped polyaniline, sodium dodecylbenzene sulfonate-doped polypyrrole, perchlorate-doped polyethylenedioxythiophene, or any other conducting polymer able to develop a percolation conductive network across the layer.

Embodiment 6

The system of embodiment 3, wherein the mixed metal-insulator semiconductor comprises Ag/KCl, Al/Ge, or a combination thereof.

Embodiment 7

The system of embodiment 3, wherein the anisotropic material comprises an intercalated graphite, a high-temperature superconductor, or a combination thereof.

Embodiment 8

The system of embodiment 1, wherein the conductive material comprises an organic and/or inorganic material able to form a conductive percolation network through insulating bulk matrix.

Embodiment 9

The system of any one of embodiments 1 through 8, further comprising a radiation source fixed in position relative to the thin-film plasmonic device and arranged to direct a monochromatic beam through the film to achieve photoemission of electrons and to excite surface plasmons.

Embodiment 10

The system of embodiment 9, wherein the radiation source comprises an X-ray source, UV source, infrared source, visible light source, or combinations thereof.

Embodiment 11

The system of embodiment 10, wherein the conductive material comprises nanoparticles embedded in an organic polymer.

Embodiment 12

The system of embodiment 11, wherein the nanoparticles comprise gold nanoparticles, nanooxides, clad nanoparticles, or mixtures thereof.

Embodiment 13

The system of embodiment 11, wherein the nanoparticles are present in an amount sufficient to expand the excitation wavelength range of the device beyond that possible without the nanoparticles.

Embodiment 14

The system of any one of embodiments 9 through 13, further comprising an array of detectors arranged so as to receive the reflected/generated excitation wave to record an absorption or shift of exciting wave indicative of plasmon resonance.

Embodiment 15

A plasmonic device comprising: an insulating substrate; alternating sets of electrically connected source and drain electrodes disposed on the insulating substrate; channels on the insulating substrate formed between the alternating electrodes; and a film comprising an organic conducting polymer overlaying the electrodes and channels.

Embodiment 16

The device of embodiment 15, wherein the insulating substrate comprises glass or an organic polymeric material.

Embodiment 17

The device of embodiment 15 or embodiment 16, wherein the electrodes comprise gold electrodes, copper electrodes, silver electrodes, ruthenium electrodes, or combinations thereof.

Embodiment 18

The device of any one of embodiments 15 through 17, wherein the organic conducting polymer comprises sulphate-doped polyaniline, sodium dodecylbenzene sulfonate-doped polypyrrole, perchlorate-doped polyethylenedioxythiophene, or any other conducting polymer able to develop a percolation conductive network across the layer.

Embodiment 19

The device of any one of embodiments 15 through 18, wherein each channel has a width of 20 micrometers to 125 micrometers.

Embodiment 20

The device of any one of embodiments 15 through 19, wherein the film has a thickness of 50 nm to 300 nm in the channels.

Embodiment 21

The device of any one of embodiments 15 through 20, wherein the film is sufficiently thick for effective operation as total resistance across the device is about 0.1-50 kOhm.

Embodiment 22

The device of any one of embodiments 15 through 21, wherein the film is a conformal film.

Embodiment 23

The device of any one of embodiments 15 through 22, wherein the electrodes are 75 micrometers to 350 micrometers wide.

Embodiment 24

The device of any one of embodiments 15 through 23, wherein the film is electrochemically deposited.

Embodiment 25

An electroactive plasmonic system comprising: a single thin-film device comprising a conductive dielectrically heterogeneous media disposed over an array of gold electrodes of alternating polarity on a dielectric substrate; a radiation source fixed in position relative to the film and arranged to direct a monochromatic beam through the film to achieve photoemission of electrons and to excite surface plasmons; and an array of photodetectors or electron detectors arranged so as to detect the shift peak electron photoemission or light adsorption peak at the surface at which surface plasmon occurs.

Embodiment 26

A method of making a plasmonic device, the method comprises: providing an insulating substrate; positioning alternating sets of source and drain electrodes on the insulating substrate such that channels are formed on the insulating substrate between the alternating electrodes; and electrochemically depositing a film comprising an organic conducting polymer on the electrodes and channels.

Embodiment 27

A method of generating plasmons in a conducting polymer, the method comprising: providing a plasmonic device comprising: an insulating substrate; alternating sets of electrically connected source and drain electrodes disposed on the insulating substrate; channels on the insulating substrate fowled between the alternating electrodes; and a film comprising an organic conducting polymer overlaying the electrodes and channels; and irradiating the conducting polymer under conditions effective to emit photoelectrons.

Objects and advantages of this invention are further illustrated by the following examples, but the particular materials and amounts thereof recited in these examples, as well as other conditions and details, should not be construed to unduly limit this invention.

EXAMPLES

Electrochemistry

Film Deposition

Thin layers of the emeraldine salt form of polyaniline (PAni) were electrodeposited at ambient temperature (i.e., about 20-25° C.) in a three-electrode electrochemical cell outfitted with a platinum wire counter electrode and a saturated Ag/AgCl reference electrode. Interdigitated arrays (IDAs) of gold electrodes on a polyethylene naphthalene substrate, each with a constant electrode gap spacing (i.e., channel width) in the range of 20-120 micrometers (μm) were used. The IDAs included 29 alternating electrodes 2.8 millimeters (mm) long and 75 micrometers (μm) wide, with a total effective area of the IDA equal to 6.09 square millimeters ($mm^2$). Indium-tin oxide (ITO) and gold covered glass slides were used as controls. The layer of PAni was deposited from a solution of 2 Molar (M) $H_2SO_4$ supporting electrolyte with 0.1 M aniline. The electropolymerization of emeraldine film was achieved galvanostatically for a total equivalent thickness of approximately 125 nanometers (nm), which was controlled by the time of deposition of 165 seconds (s) (J. C. Lacroix, Kanazawa, K. K., Diaz, A., *Journal of the Electrochemical Society*, 136, 1308 (1989)). The films were deposited alternatively in five pulses of 33 seconds or a single pulse of 165 seconds (s), maintaining current density at 0.25 milliamperes per square centimeter ($mA/cm^2$). The cyclic voltammetry was used to verify the redox potentials (see FIG. 2). A Solartron Electrochemical Interface 287 (Solartron Analytical, Farnborough, Hampshire, UK) was used for all electrochemical experiments. After the deposition, the samples were rinsed with deionized water, blow-dried with nitrogen, mounted on a sample bar, and placed into the vacuum chamber of an X-ray photoelectron spectroscopy (XPS) apparatus.

X-Ray Photoelectron Spectroscopy

A Kratos Axis Ultra X-ray photoelectron spectrometer (Kratos Analytical, Chestnut Ridge, N.Y.) was used to collect the XPS spectra using a monochromatic Al $K_\alpha$ radiation at 1486.6 electron volts (eV) and a 700×300 micrometer (μm) spot size for all analyses. The X-ray gun was set at 15 kilovolt (kV) for all measurements with a total power of 225 watts (W). The emitted electrons were confined in a magnetic lens system and directed into a concentric hemispherical analyzer, where they were distributed by their kinetic energy and then registered on the multichannel detector plate in a Delayed Line Detector (DLD). A pass energy of 40 eV was used to collect all core levels (C 1s, S 2p, N 1s, and O 1s) (see FIG. 3), and a 160 eV pass energy was employed for the surveys acquisition. All binding energies were referenced to the double C═C bond in C 1s peak at 284.7 eV, which is predominant in the quinoid/benzoid chemical structure of partially-oxidized polyaniline or emeraldine salt form (A. P. Monkman, Stevens, G. C., Bloor, D., Journal of Physics D: Applied Physics, 24, 738 (1991), X. L. Wei, M. Fahlimn, and K. J. Epstein, Macromolecules, 32(9), 3114 (1999)). The chemical imaging was carried out with a Field of View 2 (FOV2) electro/static/magnetic lenses configuration, 160 eV pass energy, and with a high-resolution aperture deployed.

Each IDA with a deposited film of doped polyaniline was mounted on a sample bar in a way that one set of electrodes was connected to the sample fork of an XYZ-manipulator and the other set of electrodes was connected to the instrument electrical ground. This enabled voltages to be applied across the polymer in vacuum. The low-energy charge compensation system (otherwise referred to herein as the charge neutralizer) was important in this Example, offsetting the plasmon phenomenon on the polymer/electrode array and, therefore spectra with and without the charge compensation system (i.e., the charge neutralization system or charge neutralizer) were taken (see FIG. 4). The charge balance between the charge neutralizer and the sample holder was maintained at 2.5 volts (V).

Results and Discussion

Electrochemistry of the $PAni/SO_4^-$ films

Figure 2:
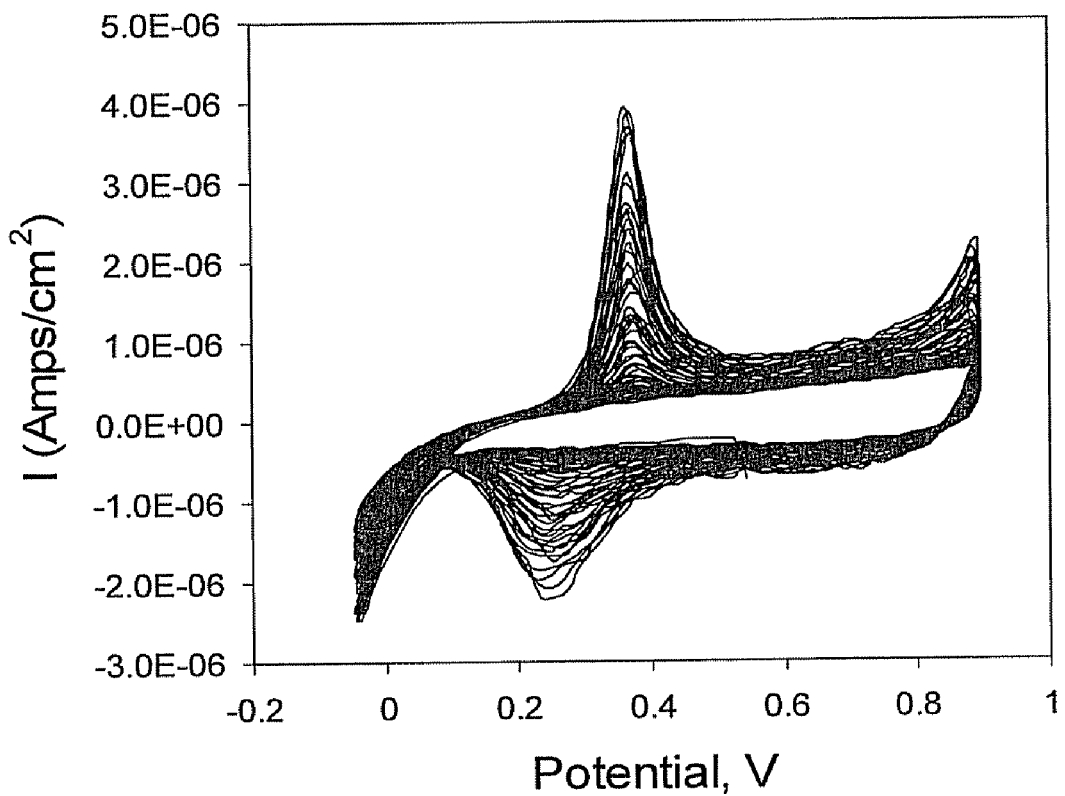
FIG. 2 shows a cyclic voltammogram of aniline polymerization in 0.1 Molar (M) aniline with 2 M $H_2SO_4$ supporting electrolyte on an interdigitated array (IDA), at a scanning rate of 50 millivolts per second (mV/s) vs. an Ag/AgCl reference electrode.

Polyaniline is a fast switching electrochromic material with reported switching times as low as 100 microseconds (μs) (J. C. Lacroix, Kanazawa, K. K., Diaz, A., *Journal of the Electrochemical Society*, 136, 1308 (1989)). Although not wishing to be bound by theory, it is believed that the switching of polyaniline is linked to the change in the oxidation state from leucoemeraldine, to emeraldine salt and to pernigraniline, such changes being accompanied by color changes. The doped emeraldine salt form is of particular interest as a conducting form of polyaniline. Electrochemical deposition of a thin polyaniline film can be achieved with either potential or current control. A typical cyclic voltammogram showing the growth of a thin film is shown in FIG. 2. Two oxidation potentials (0.35 and 1.1 V versus Ag/AgCl) define the changes in the oxidation state of polyaniline, where the polymer is conductive between these potentials. Concurrently, the deposited polymer is protonated and doped with $SO_4^-$ from the supporting acidic electrolyte. In this Example, the thin emeraldine films were deposited galvanostatically, providing control of the film thickness and maintaining the balance of applied potential below the second oxidation potential of about 1.1 V, hence preventing the conversion of the mixed benzoid/quinoid emeraldine structure to the non-conductive fully-quinoid pernigraniline structure. The obtained films were olive-green color and had visibly uniform coverage under optical microscope.

The layout of a simple thin film plasmonic device (TFPD) includes a layer of PAni doped with $SO_4^-$ that is deposited over alternating sets of source and drain electrodes, and thus electrically connecting them. A schematic of a cross-sectional view of the TFPD geometry can be seen in FIG. 1. The separation between the source and drain electrodes is defined as the channel, with length, L (FIG. 1), and width, W (FIG. 1). The resistance of the devices varied from 140 to 200 Ohm.

Excitation of Plasmons in Emeraldine Salt

The properties of the various forms of PAni, have been investigated using various experimental techniques, including nuclear magnetic resonance (NMR) (R. Mathew, Mattes, B. R., Espe, M. P., *Synthetic Metals*, 131, 141 (2002)), resistivity and nanohardness measurements, X-ray photoelectron spectroscopy (XPS) (X. L. Wei, M. Fahlman, and K. J. Epstein, *Macromolecules*, 32(9), 3114 (1999), D. Bloor, Monkman, A. P., *Synthetic Metals*, 21, 175 (1987)), and the ultraviolet photoemission spectroscopy (UPS) (H. Sakamotoa, Mizoguchia, K., Ishiia, H., Miyaharaa, T., Masubuchib, S., Kazamab, S., and T. Matsushitac, Sekiyamac, A., Suga, S., *Synthetic Metals*, 101, 479 (1999)). XPS has been useful for the study of conducting polymers because it may allow the observation of chemical and electronic states simultaneously, thus linking the oxidation state of the polymer with its conductivity. The oxidation and electronic states of protonated nitrogen species in PAni have been explored (A. P. Monkman, Stevens, G. C., Bloor, D., *Journal of Physics D: Applied Physics*, 24, 738 (1991), X. L. Wei, M. Fahlman, and K. J. Epstein, *Macromolecules*, 32(9), 3114 (1999), Bloor, Monkman, A. P., *Synthetic Metals*, 21, 175 (1987), X. L. Wei, M. Fahlman and K. J. Epstein, *Macromolecules*, 32, 3114 (1999)). The conductivity of the emeraldine salt form is associated with cationic nitrogen atoms in amine/imine species, or polarons and bipolarons, which may manifest themselves in the form of shake-up peaks (M. Fahlman, Salaneck, W. R., in *Organic Electronic Materials: Conjugated Polymers and Low Molecular Weight Organic Solids*, R. Farchioni, Grosso, G. Editor, p. 202 (pp. 181-214), Springer Verlag, Berlin, N.Y., Heidelberg (2001), D. Briggs, Seah, M. P., *Practical surface analysis: by auger and x-ray photo-electron spectroscopy*, pp. 1-533, Wiley, Chichester (1983)) in the secondary structure of the spectra, at the higher binding energies for nitrogen. These carriers may be associated with a charge distortion on the polymer chain as a result of oxidation and are positioned inside the band gap (J. L. a. S. G. B. Bredas, *Accounts of Chemical Research*, 18, 309 (1985)). However, the significance of polarons and bipolarons for conductivity of the polymer arise when the polymers are doped, when the polarons and bipolarons gain the ability to form their own bands, closing the band gap for a metallic-like conductivity.

Figure 3:
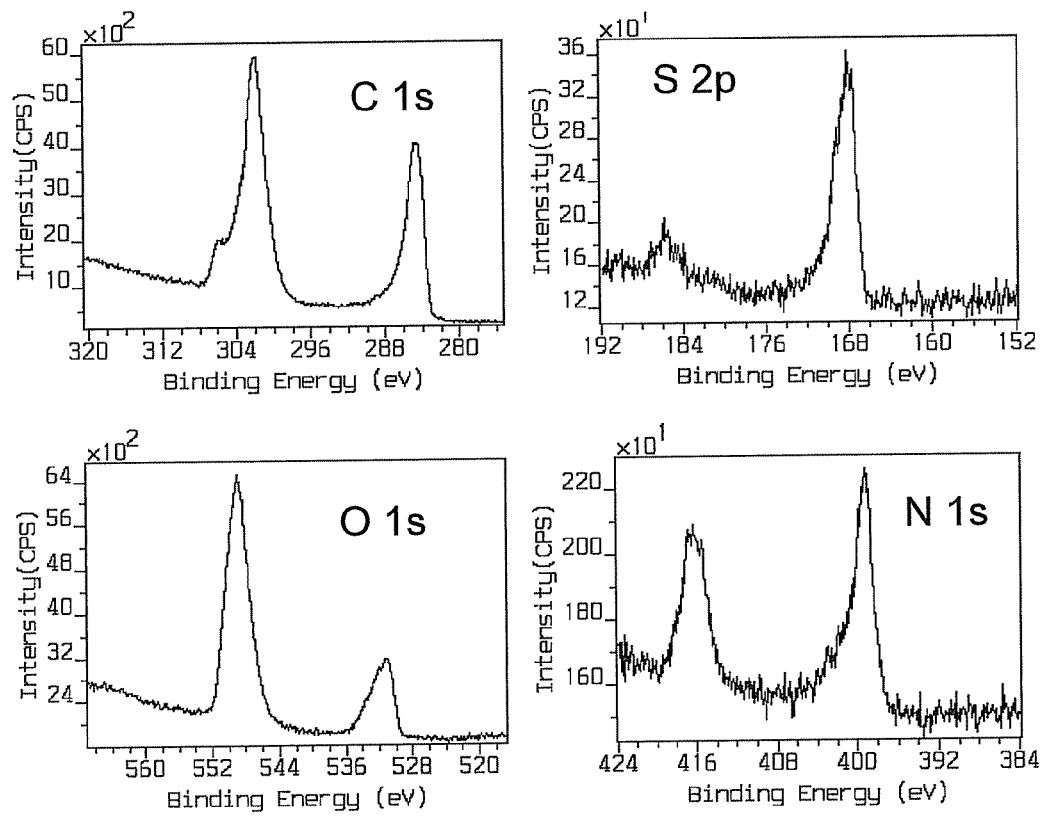
FIG. 3 shows high-resolution x-ray photoelectron spectroscopy (XPS) spectra from individual elements (C 1s, S 2p, O 1s, and N 1s) at an X-ray power of 225 watts (W) and pass energy of 40 electron volts (eV).

An XPS analysis of electrochemically deposited PAni/$SO_4^-$ films on arrays of conducting electrodes indicated an additional peak in the profile. A plasmon energy loss peak is positioned at about 18-22 eV from the primary peak at 284.7 eV for C 1s (FIG. 3). These sidebands were detected for other elements as well, particularly strong for O 1s peak, which, although not wishing to be bound by theory, is believed to be mostly tied to the dopant. This additional feature (i.e., the plasmon energy loss peak) is sharp and uncharacteristically strong in intensity, with FWHM (full width at half maximum) close in value to the main feature (e.g., the primary peak at 284.7 eV for C is (FIG. 3)). Such strong plasmon features can be affiliated with so-called intrinsic plasmon, which have been detected previously on metals with a narrow conduction bands, e.g., Al, Mg and Be. For example, the separation of the intrinsic plasmon with Be 2p ground state has been reported to be about 20 eV (S. Hufner, *Photoelectron Spectroscopy; Principles and Applications*, pp. 1-662, Springer-Verlag, Berlin, Heidelberg, N.Y. (2003), M. Kurth, Graat, P. C. J., Mittemeijer, E. J., *Applied Surface Science*, 220, 60 (2003)), while the intensity is beyond the typical plasmon (extrinsic or surface) peak height (typically not more than 10% of the primary peak height). The plasmon energy loss satellite (i.e., the plasmon energy loss peak) can be offset by the deployment of a low energy electron charge neutralizer, or when a film is deposited over continuous conductive substrate such as indium-tin-oxide (ITO) or a gold-coated glass slide. In all of these cases, the spectra are limited to the primary peaks of the elements and, although not wishing to be bound by theory, it is believed to likely be the reason that plasmon energy loss satellite peaks have not been reported for conducting polymers in the past.

The valence band spectra are also consistent with the existence of plasmon resonance. A typical valence band spectra for polyaniline exhibits two groups of peaks related to C 2p and C 2s orbitals. A peak attributed to N 2s is also observed at approximately 22 eV, when the signal is sufficient and not offset by the dopants (D. Briggs, *Surface Analysis of polymers by XPS and static SIMS*, pp. 1-198, The Press Syndicate of The University of Cambridge, Cambridge (1998)). A direct comparison of the valence band spectra obtained on the polyaniline film deposited over the IDA with, and without, the deployment of the charge neutralizer can be seen in FIG. 4. The photoemission of the electrons from the core and valence levels introduced additional sidebands (e.g., 401 in FIG. 4) into the valence band profiles, which is indicative of for a true plasmon feature as manifesting itself throughout the band structure (S. Hufner, *Photoelectron Spectroscopy; Principles and Applications*, pp. 1-662, Springer-Verlag, Berlin, Heidelberg, N.Y. (2003)). The additional features (e.g., 401 in FIG. 4) may be due to screening of photoholes.

It has been established that a pristine emeraldine base can be transformed from insulator to conductor by oxidation, followed by protonation and doping, which is also known as the insulator-metal transition (IMT). With the fraction of free electrons as low as $10^{-3}$ (X. L. Wei, M. Fahlman, and K. J. Epstein, *Macromolecules*, 32(9), 3114 (1999), M. Fahlman, Salaneck, W. R., in *Organic Electronic Materials: Conjugated Polymers and Low Molecular Weight Organic Solids*, R. Farchioni, Grosso, G. Editor, p. 202, Springer Verlag, Berlin, N.Y., Heidelberg (2001)), the hopping mechanism of conductivity is prevalent over the band transport and attributed to the range of conductivity of the conducting polymers. As a conductive form of a conjugated polymer, the emeraldine salt is strongly inhomogeneous morphologically, in terms of the insulator metal transition. Localization of the conducting metallic chains in emeraldine salt yields to three-dimensional percolation condition, where the conductivity function $\sigma_{dc}$ can be linked to a composite of volume fraction affiliated with a Drude metallic conductor. The origins of a plasmon peak in conductive polyaniline may be looked upon as a primary step of conductivity in conjugated polymers, the departure of electrons. Both the oxidation and photoemission processes may cause departure of electrons and thus, for example, initiate relaxation processes in electronic structure, leading to generation of the positive charge localized over the chain of polymer. In the case of photoemission, the relaxation processes may be linked to the emission of Auger electrons, but some uncompensated positive charge may remain on the polymer chain. While the localization of this charge is uncertain, the screening of the positive charge by emanating electrons was important in order to maintain the charge balance on the atoms.

Voltage Modulation Across the Array

Figure 5:
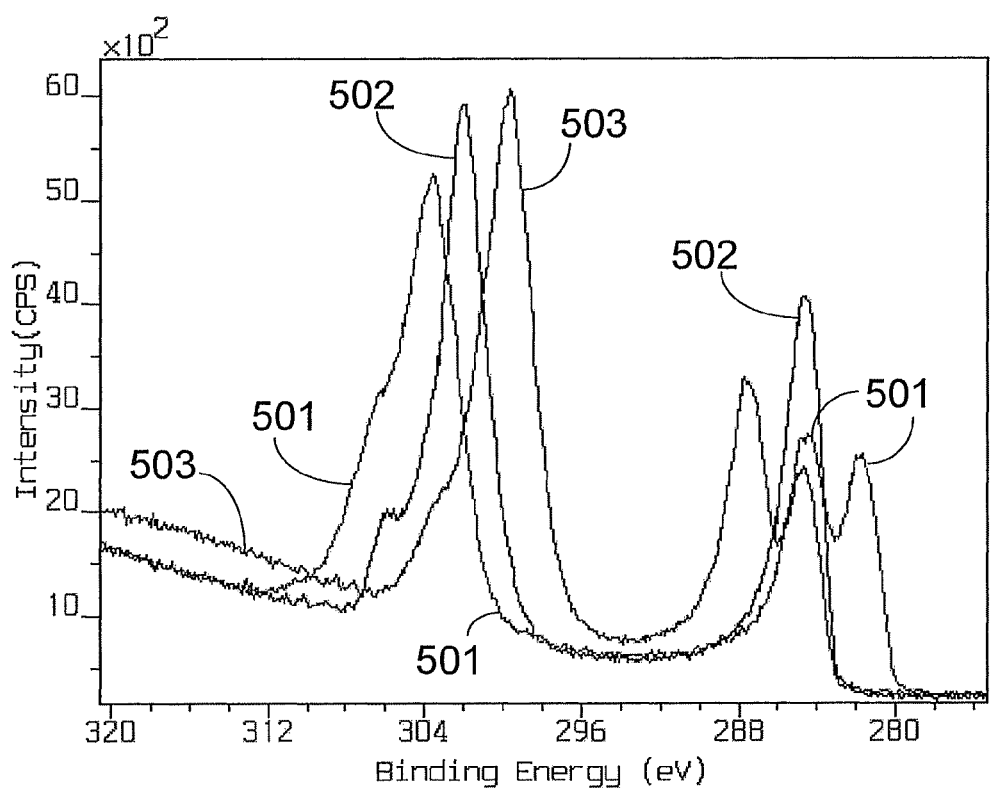
FIG. 5 shows an effect of voltage modulation across a thin PAni/$SO_4^-$ film on an interdigitated array (IDA), XPS profiles for C 1s at 0 V (502), +3 V (503) and −3 V (501).

The IDA was mounted on the instrument's (i.e., the Kratos Axis Ultra X-Ray photoelectron spectrometer's) sample bar in a way to allow a voltage to be applied across the two electrodes of the IDA. This was accomplished by connecting one electrode to the sample arm and shorting the second electrode to the instrument's ground through the magnetic lens in a manner similar to the approach used by the instrument's manufacturer to power the motor present on a sample bar used for depth profiling (*Axis Ultra DLD Operating Manual*, Kratos Analytical Ltd., Manchester (2005)). In so doing, one electrode was biased with respect to ground and the response of the film was monitored. The applied potential shifted the work function of the instrument, resulting in a change of the binding energy of the primary peak (e.g., 285 eV for aliphatic C 1s and C—C bond, or 284.7 eV for C═C bond). Since the film was applied over the array having two groups of alternating ground/biased electrodes (102 and 103 in FIG. 1), the emeraldine film over specific electrodes was expected to demonstrate congruent shifts (i.e., shifts in the same direction) in binding energy for the chemical state. As can be seen in FIG. 5, the primary peak splits into two with a separation of 3 eV, stemming from the applied potential of ±3 V (see curves 501 and 503 in FIG. 5). For the plasmon energy loss feature in the spectra, the effect of the applied potential is not as straightforward to interpret. In contrast to the behavior of the primary peak, the plasmon peak moves in an opposing direction to the applied potential with a total shift of approximately 2 eV (FIG. 5). While not wishing to be bound by theory, the direction of the shift and indirect translation of applied potential into the shift of the additional feature are believed to be indicative of the intrinsic nature of the peak, where the applied potential directly affects, for example, the Fermi sea of carriers responsible for conductivity in the polymer, or phonon-assisted hopping of electrons, rather then photoelectrons themselves.

Figure 6:
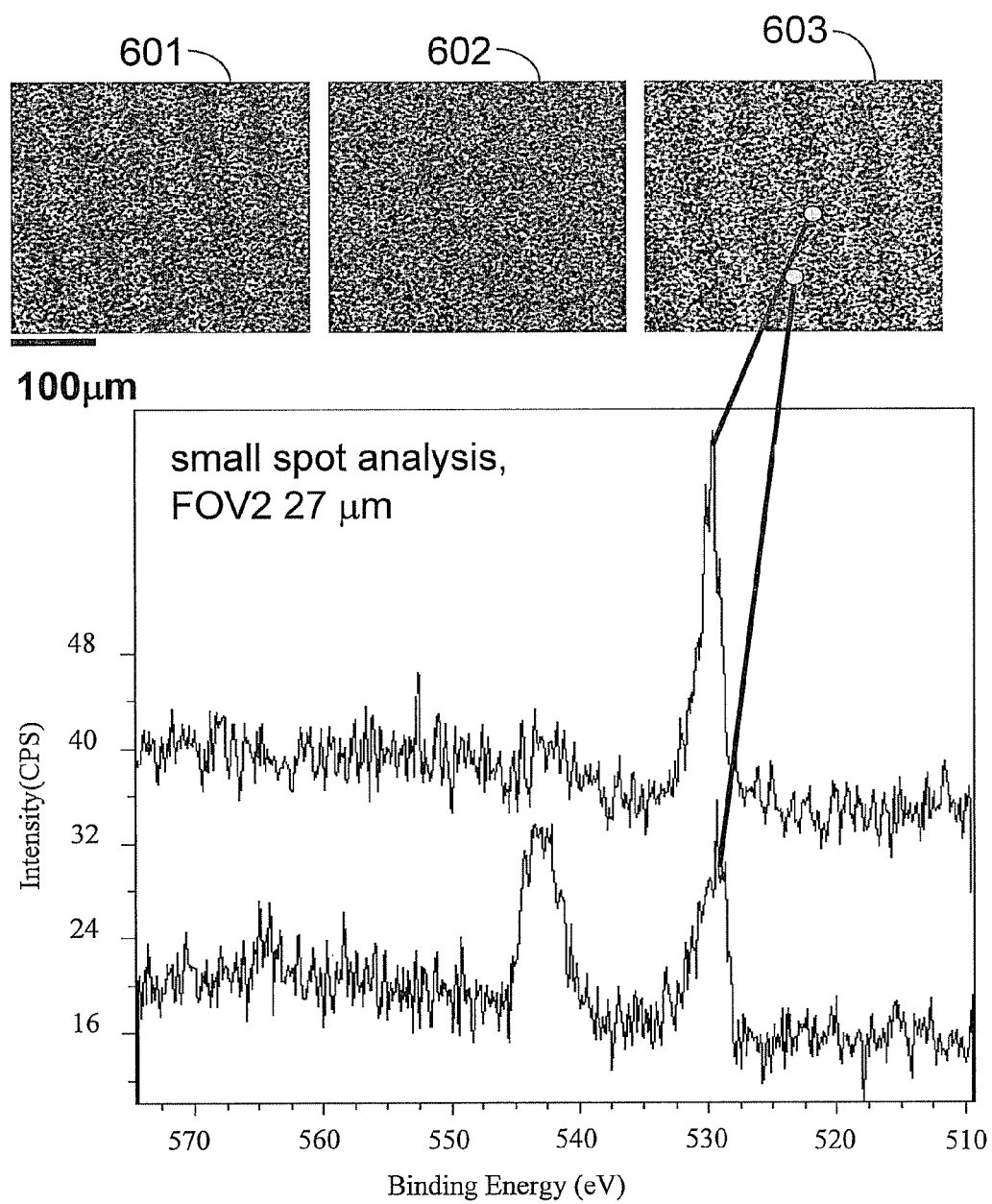
FIG. 6 shows three micrographs of chemical imaging of a PAni/$SO_4^-$ film in terms of binding energy of O 1s: primary peak 531 eV (left image), intrinsic plasmon peak 550 eV (center image) and arithmetic subtraction of the intrinsic plasmon image from the primary binding energy image (right image). The scale bar represents 100 micrometers and corresponds to the left, center, and right images.

Localization of Plasmon Loss Energy Function in PAni/SO$_4^-$ on Interdigitated Array The plasmon loss function of the array of electrodes in the thin film plasmonic device (TFPD) can be localized with help of the chemical imaging of the emeraldine film in terms of the primary chemical state and the plasmon photoemission. An oxygen peak, associated with the dopant, was used to record the chemical distribution over the film. In FIG. 6, showing three micrographs, the chemical imaging of PAni/SO$_4^-$ film at a fixed binding energy of 531 eV gave the left image 601 with clear contrast between the film over conducting golden electrodes (bright stripes) and the film over the insulating gaps. The central image 602 represents the distribution of chemical states in terms of the photoemission of plasmon at 550 eV, with a subtle contrast over the array. An arithmetic treatment of both images, with subtraction of the image recorded at the binding energy of primary chemical state from the plasmon distribution image, gave a combined micrograph 603 showing a dominance of the plasmon loss energy function in the insulating gaps of the array.

These observations were supported by a small spot analysis, as seen in FIG. 6. The spectra were recorded from spots of 27 micrometers (μm) in diameter positioned above the electrode (FIG. 6, upper curve) and the gap (FIG. 6, lower curve). The spectrum taken from the film over the gap demonstrated a second peak and, thus, confirmed localization of the plasmon photoemission in the area above the insulating substrate of the IDA, where the injection of electrons into the band structure was limited. The variation of the plasmon binding energy recorded at 543 eV in the small spot analysis was due to the instrument as a result of a deployment of magnetic and electrostatic lenses necessary for a small spot analysis mode of the analyzer.

Intrinsic Nature of Plasmon in Emeraldine Salt

In response to the monochromatic radiation (Al K$_\alpha$=1486.6 eV), the core electrons emanated from a shallow depth of the polymer of approximately 5 nanometers (nm). The primary peak represented a case of an elastic photoemission, e.g. 284.6 eV for C 1s, where the whole energy of X-ray photon transforms into the kinetic energy of an emanated electron and the binding energy of the electron to the core level yields to the relationship $$E_k = h\nu - E_b - \phi,$$

where $E_k$ is a kinetic energy of emitted electron, hν is the energy of an initial photon of X-ray radiation, $E_b$ is a binding energy, and ϕ is a work function.

The situation changes when the electrons experience inelastic scattering and/or the photoemission suffers a loss of energy. The loss of energy translates into additional features on the spectra, including shake-up peaks, plasmon loss features and ionization loss (D. Briggs, Seah, M. P., *Practical surface analysis: by auger and x-ray photo-electron spectroscopy*, pp. 1-533, Wiley, Chichester (1983)). Shake-up peaks generally exhibit an intensity of 5-10 percent of the primary peak and are positioned within 6-10 eV of the main feature, whereas ionization peaks usually develop as a depressed extended feature on the profile. As seen in FIG. 3, high-resolution XPS spectra of C 1s, N 1s, O 1s, and S 2p exhibit additional sharp features on the profiles of freshly deposited polyaniline films that significantly differ from that associated with shake-up or ionization loss.

Generation of photoholes may be important for plasmon phenomena, the positive charge of the photoholes may be neutralized by the electrons from other orbitals moving into the site of the photoemission process. A departure of an electron from the core level may be treated as an instantaneous switch of local (point charge) potential. This point charge may cause a variety of relaxation processes, including Auger electron emission, uptake of electrons into conductive band from the substrate, and/or attenuation of the wave function of the electrons in both valence and conductive bands. The attenuation of the wave function is of particular interest as it may shed the light on the origins of the plasmon peak and suggest the intrinsic nature of the plasmon. Although not wishing to be bound by theory, the created plasmonic sidebands in the core and valence level may be identified as an intrinsic property of the photoemission process, as opposed to the loss of energy due to the inelastic scattering of the electrons resulting in extrinsic plasmons. The intrinsic plasmon may arise at site of the bulk plasmon, contributing to the total height of the plasmon peak.

Figure 4:
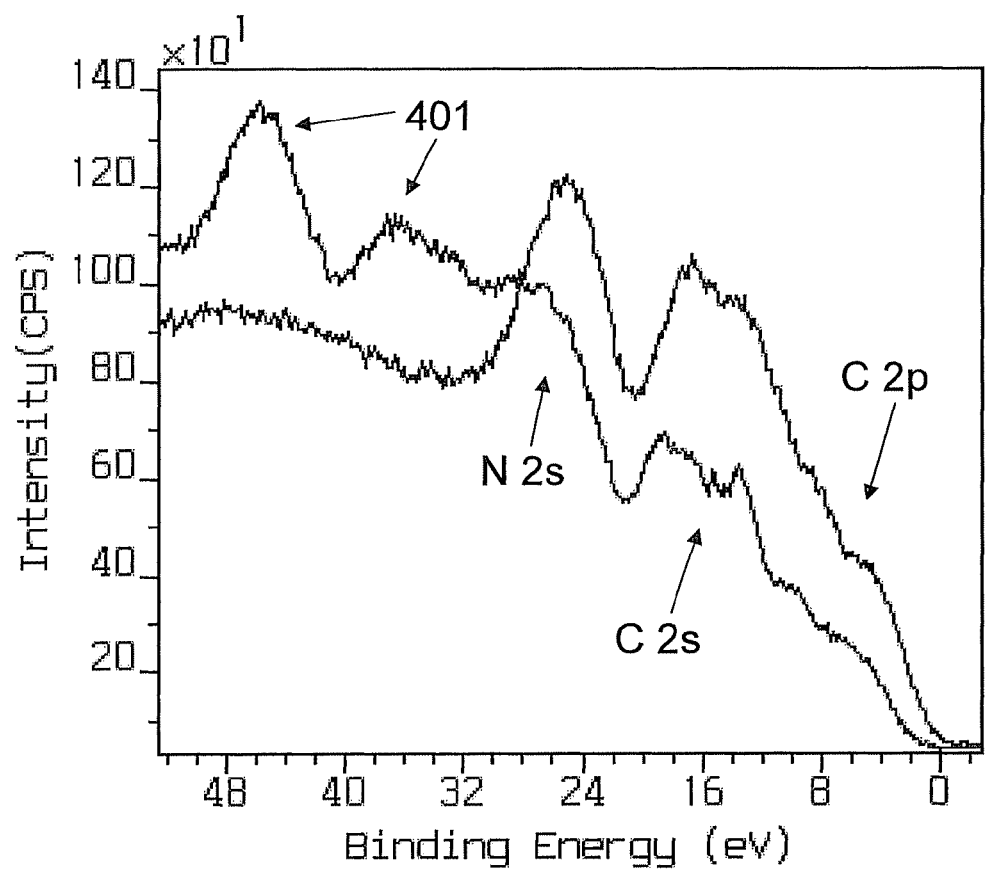
FIG. 4 shows additional features in valence band spectra, a profile taken with charge neutralization (lower curve) vs. a profile taken without charge neutralization (upper curve).

A neutralization of an individual photohole may lead to a quantized excitation in conduction electron system, or, until the charge of photoholes is neutralized by free electrons, the generated photoholes undergo a complex screening process by the Fermi sea of conductive carriers (S. Hufner, *Photoelectron Spectroscopy; Principles and Applications*, pp. 1-662, Springer-Verlag, Berlin, Heidelberg, N.Y. (2003), N. V. Smith, "Angular Dependent Photoemission" in *Topics in applied physics Vol. 26/1978: Photoemissions in Solids I*, M. Cardona, Ley, L. Editor, pp. 237-264, Springer, Berlin, Heidelberg (1978)). The shift on the core spectra of the emeraldine film indicates that the ejected photoelectrons measure the spectral function of the screened photoholes, losing their energy in the process (M. Kurth, Graat, P. C. J., Mittemeijer, E. J., *Applied Surface Science*, 220, 60 (2003)). The significant shift in kinetic energy (up to 22 eV) and sharpness of the feature on the profile also may favor the intrinsic nature of the plasmon feature. The voltage modulation across the emeraldine film on the IDA may also support the intrinsic nature of the additional peak (FIG. 4). The indirect response to the applied potential and failure to translate the applied potential into an equivalent shift of the binding energy may suggest that the potential interacts with photoelectrons indirectly, affecting the continuum of carriers involved in the screening process.

The situation may change when the electrons are readily available for the injection into the band structure of the polymer, e.g., through the application of low-energy charge neutralizer or from a conductive substrate. The injected free electrons occupy the place of the excited electrons, canceling the photoholes and their interaction (screening process) with the conductive system of the polymer and, thus, offset the plasmon feature on the film, as the ejected photoelectrons leave the surface without additional loss of energy. The geometry of the device plays a role in the phenomena. The width of the channel in the IDA exceeds the thickness of the thin film by a factor of 10 or more (e.g., 100 or more, etc.), restricting the passage of the electrons between the electrodes in the array. Conversely, when the supply of electrons is available throughout the continuous conductive surface, as in case of a conductive ITO or gold-coated substrate, the intrinsic plasmon peaks are not observed.

Although not wishing to be bound by theory, the channels themselves (space between 102 and 103 in FIG. 1) may be seen as domains of photoholes screening, where the photoelectrons lose their energy in interaction with the conductive system of the polymer (M. Kurth, Graat, P. C. J., Mittemeijer, E. J., *Applied Surface Science*, 220, 60 (2003)). The chemical imaging of the film on the IDA in terms of the fixed binding energy indicates a significant contrast between the channel and the electrodes, as seen in FIG. 6 (right image 603). The emission from the channels is limited for the energies of both O 1s primary and plasmon peaks. This is an indication that X-ray radiation alters the density of states of the emeraldine in the channels.

The photoexcitation of electrons in the electrochemically deposited doped PAni/$SO_4^-$ over the array of the alternative electrodes produced the additional plasmon feature on the XPS profiles. The core level and valence band spectra, the voltage modulation across the film on the IDA, the chemical imaging and small spot analysis, all indicating a complex screening mechanism of the generated photoholes. In a complex excitation/depression mechanism of photoholes, the photoelectrons may lose their energy, while their interaction with the Fermi sea of conductive carriers may give a rise of the plasmon peak height (S. Hufner, *Photoelectron Spectroscopy; Principles and Applications*, pp. 1-662, Springer-Verlag, Berlin, Heidelberg, N.Y. (2003)). Alternatively, a direct injection of free electrons from the low-energy charge neutralizer or continuous conductive substrate may offset an intrinsic contribution to the plasmon height.

The effect shown in the present disclosure may be of significance for design of novel plasmonic devices. While the material of the thin film over the IDA remained essentially the same, the localization of the plasmon feature to the gaps in the interdigitated arrays highlighted the variable electronic properties of the conducting polymer, which may be used in novel plasmonic devices for biochemical sensing, photonics and nonvolatile memory, etc.

The complete disclosures of the patents, patent documents, and publications cited herein are incorporated by reference in their entirety as if each were individually incorporated. Publications citing a single page are meant to refer to and incorporate herein the entire article, chapter, or book cited. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A plasmonic system comprising a thin-film plasmonic device comprising a layer of a conductive material positioned over an array of electrodes of alternating polarity, and a radiation source fixed in position relative to the thin-film plasmonic device and arranged to direct a monochromatic beam through the film to achieve photoemission of electrons and to excite surface plasmons.

2. The system of claim 1, wherein the conductive layer comprises dielectrically heterogeneous media.

3. The system of claim 2, wherein the dielectrically heterogeneous media comprises a conducting polymer, a mixed metal-insulator semiconductor, an anisotropic material, or combinations thereof.

4. The system of claim 3, wherein the conducting polymer comprises polyaniline (PAni), polypyrrole (PPY), polyethylenedioxythiophene (PEDOT), polyaniline boronic acid (PABA), each of which is optionally externally doped or self-doped, or combinations thereof.

5. The system of claim 4, wherein the conducting polymer comprises sulphate-doped polyaniline, sodium dodecylbenzene sulfonate-doped polypyrrole, perchlorate-doped polyethylenedioxythiophene, or any other conducting polymer able to develop a percolation conductive network across the layer.

6. The system of claim 3, wherein the mixed metal-insulator semiconductor comprises Ag/KCl, Al/Ge, or a combination thereof.

7. The system of claim 3, wherein the anisotropic material comprises an intercalated graphite, a high-temperature superconductor, or a combination thereof.

8. The system of claim 1, wherein the conductive material comprises an organic and/or inorganic material able to form a conductive percolation network through insulating bulk matrix.

9. The system of claim 1, wherein the radiation source comprises an X-ray source, UV source, infrared source, visible light source, or combinations thereof.

10. The system of claim 9, wherein the conductive material comprises nanoparticles embedded in an organic polymer.

11. The system of claim 10, wherein the nanoparticles comprise gold nanoparticles, nanooxides, clad nanoparticles, or mixtures thereof.

12. The system of claim 10, wherein the nanoparticles are present in an amount sufficient to expand the excitation wavelength range of the device beyond that possible without the nanoparticles.

13. The system of claim 1, further comprising an array of detectors arranged so as to receive the reflected/generated excitation wave to record an absorption or shift of exciting wave indicative of plasmon resonance.

14. An electroactive plasmonic system comprising:
a single thin-film device comprising a conductive dielectrically heterogeneous media disposed over an array of gold electrodes of alternating polarity on a dielectric substrate;
a radiation source fixed in position relative to the film and arranged to direct a monochromatic beam through the film to achieve photoemission of electrons and to excite surface plasmons; and
an array of photodetectors or electron detectors arranged so as to detect the shift peak electron photoemission or light adsorption peak at the surface at which surface plasmon occurs.

* * * * *